(12) United States Patent
Fastow et al.

(10) Patent No.: US 6,961,267 B1
(45) Date of Patent: Nov. 1, 2005

(54) METHOD AND DEVICE FOR PROGRAMMING CELLS IN A MEMORY ARRAY IN A NARROW DISTRIBUTION

(75) Inventors: Richard M. Fastow, Cupertino, CA (US); Lee E. Cleveland, Santa Clara, CA (US); Chi Chang, Redwood City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/738,301

(22) Filed: Dec. 16, 2003

(51) Int. Cl.[7] .............................................. G11C 16/04
(52) U.S. Cl. ......................... 365/185.28; 365/185.19; 365/185.22
(58) Field of Search ...................... 365/185.28, 185.22, 365/185.18, 185.19, 185.03, 185.29

(56) References Cited

U.S. PATENT DOCUMENTS 6,490,204 B2 * 12/2002 Bloom et al. .......... 365/185.28

* cited by examiner

Primary Examiner—Gene N. Auduong

(57) ABSTRACT

Accurately programming a memory cell. A voltage is applied to a drain of the memory cell to program the cell. After applying the voltage, the cell is verified as to whether it is programmed to a desired level. The magnitude of the programming voltage is increased and applied to the drain, and the memory cell is re-verified for the desired level. This is repeated until the memory cell is programmed to the desired level. Additional memory cells are programmed in this fashion in order to program multiple memory cells in a narrow distribution around the desired level. The programming can be done one memory cell at a time or many cells can be programmed in parallel. Further a ramped programming voltage can applied to the gate of the memory cell(s), such that the ramped voltage to the gate and the ramped voltage to the drain both program the memory cell.

15 Claims, 6 Drawing Sheets

METHOD AND DEVICE FOR PROGRAMMING CELLS IN A MEMORY ARRAY IN A NARROW DISTRIBUTION

TECHNICAL FIELD

The present invention generally pertains to the field of memory devices. More particularly, embodiments of the present invention are related to a method for programming cells in a memory device in a narrow programming distribution by applying a ramped programming voltage to drains of the memory cells.

BACKGROUND ART

Non-volatile, re-programmable memory devices such as flash memory are highly desirable and have many applications from storing a computer system's BIOS to functioning as a memory for devices such as digital cameras. Typically, such memory devices may be reprogrammed hundreds of thousands of times and may be programmed or erased in blocks of, for example, hundreds or thousands of bits. Such devices may operate by storing a charge in a memory cell. For example, a typical flash memory cell may be programmed to hold a charge in a floating gate region of a transistor.

A flash memory cell can be a field effect transistor (FET) that includes a select gate, a floating gate, a drain, and a source. The select gate will also be referred to throughout this description as "the gate." A memory cell can be read by grounding the source, and applying a voltage to a bitline connected with the drain. By applying a voltage to the wordline connected to the select gate, the cell can be switched on and off.

Programming a memory cell is achieved by trapping excess electrons in the floating gate to increase the threshold voltage. This reduces the current conducted by the memory cell when the select voltage is applied to the select gate. The memory cell is programmed to a desired level if the memory cell current is less than a reference current while the select voltage is applied to the select gate. The memory cell is erased when the memory cell current is greater than the reference current while the select voltage is applied.

Memory cells with only two programmable states contain only a single bit of information, such as a "0" or a "1". A multi-level cell ("MLC") can be programmed with more than one level. For example, a memory cell can be programmed to have one of four different threshold voltages. Each threshold voltage level is mapped to corresponding bits of information. Thus, a multi-level cell is programmed with one of four threshold voltage levels that correspond to binary "00", "01", "10", and "11". Unfortunately, a shift in the threshold voltage after programming can cause a data misread.

Two of the primary causes of threshold voltage shift are the "data retention" effect and the "read disturb" effect. The "data retention" effect is a shift in threshold voltage that results from the normal passage of time. This shift in the threshold voltage toward the erase state (e.g., lowest threshold voltage). The "read disturb" effect is a shift in the threshold voltage that results from reading the memory cell. For the read disturb effect to be appreciable, typically many reads must occur. The read disturb effect is away from the erase state (e.g., increases the threshold voltage). When the threshold voltage level shifts too far in either direction, it will be interpreted as representing the next higher or lower threshold voltage level and thus the data will be misread. To prevent such misreads, the memory cells can be programmed in a narrow distribution, which increases the margin between the states.

Prior art FIG. 1 shows a representation of a four-level multilevel cell program voltage diagram 100. The program voltage distribution ("distribution") of the four levels are shown between lines 102 and 104, 106 and 108, lines 110 and 112, and above line 114, respectively. The programming distribution for the lowest level is about 2.5V, distribution of middle two levels are about 500 mV, and the distribution of the highest level is about IV. A four-level multilevel memory cell can be programmed with any one of these voltage levels. Because the cell can store one of four binary values, it can store two bits of information. The data margin ("margin"), also called a guard band, is the voltage levels between distributions that is not normally used. The margins are shown in prior art FIG. 1 between lines 104 and 106; lines 108 and 110; and lines 112 and 114. For example, the data margin can be about 700 mV to IV.

Prior art FIG. 2 is a graph 200 illustrating the effect of the phenomena called "read disturb." Read disturb occurs after the cell has been read many times without being reprogrammed. The programming distributions are shifted to the right, which represents a positive voltage shift. Distributions 230, 232, 234, and 236 represent the distributions 220, 222, 224, and 226 after they have been affected by the read disturb. Eventually, the read disturb can become so severe that the stored data becomes unreliable.

Prior art FIG. 3 is a graph 300 illustrating the effect of the phenomena called "data retention" on two of the four distributions. Data retention causes the distributions 222 and 224 to be shifted to the left as shown by distributions 322 and 324, which represent a negative voltage shift. Over time if the cell is not reprogrammed, the data retention shift can cause the stored data to become unreliable.

To widen the voltage margins, multi-level flash may operate at higher voltages than other memories. However, higher operating voltages cause other problems, such as oxide breakdown. Thus, alternative means of increasing margins are sought for this and other floating gate memories.

Thus, a need has arisen for a method of programming a multi-level cell memory array in a narrow distribution. An even further need exists for such a method that is efficient.

SUMMARY

Embodiments of the present invention provide a method of programming a multi-level cell memory array to a narrow distribution. Embodiments of the present invention are very efficient in this programming. Embodiments of the present invention provide do not require high voltages to be applied in the programming and verifying of the memory cell.

A method for accurately programming a memory cell is disclosed. In one embodiment, a voltage is applied to a drain of the memory cell to program the memory cell. After applying the voltage, the memory cell is verified as to whether it is programmed to a desired level. The magnitude of the programming voltage is increased and applied to the drain, and the memory cell is re-verified for the desired level. This is repeated until the memory cell is programmed to the desired level. Thus, the memory cell is programmed very accurately to the desired level by applying a ramped programming voltage to the drain.

In another embodiment, a ramped programming voltage is applied to the gate of the memory cell, such that the ramped voltage to the gate and the ramped voltage to the drain both program the memory cell. The gate voltage is increased and re-applied to the gate, along with the drain programming voltage, if the verify indicates that the desired programming level is not yet reached.

Another embodiment provides for a method of programming cells on a multi-level cell (MLC) memory array in a narrow distribution. The method applies a first voltage to a drain of a first memory cell. The method determines whether the first memory cell is programmed to a desired level after applying the first voltage. The method increases the first voltage, applies the increased voltage to the drain, and re-determines whether the desired programming level is achieved. The programming voltage is increased and the cell is re-verified until the first memory cell is programmed to the desired level. The method further programs at least one additional memory cell in the memory array in order to program a plurality of memory cells in a narrow distribution around the desired level. The programming can be done one memory cell at a time or many cells can be programmed in parallel.

Still another embodiment of the present invention is a multi-level cell memory device. The device comprises an array of memory cells suitable for multi-level programming. The device has a first circuit that is operable to apply a programming voltage to drains of the memory cells. The device further has a second circuit that is operable to verify whether the memory cells are programmed to a desired level of a plurality of levels. The device also has a third circuit that is operable to increase the programming voltage to the drains if the second circuit determines that the verify fails.

These and other advantages of the present invention will no doubt become obvious to those of ordinary skill in the art after having read the following detailed description of the preferred embodiments which are illustrated in the various drawing Figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1:
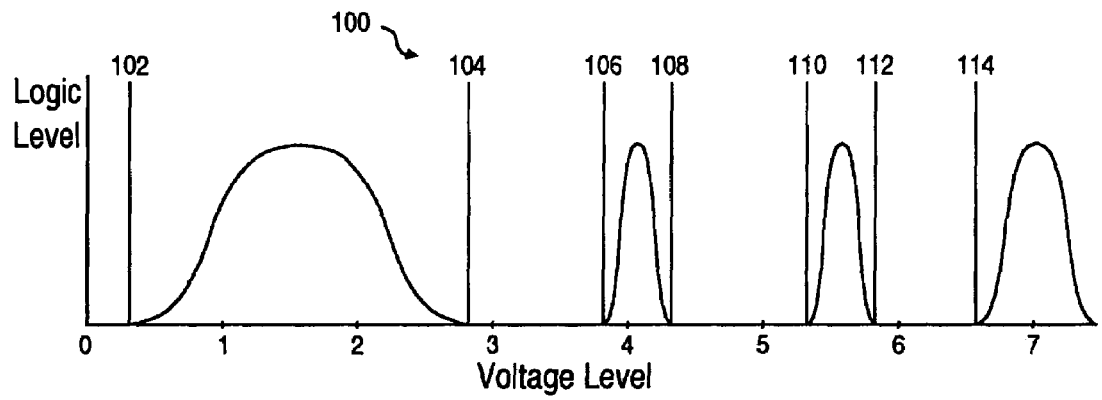
FIG. 1 is a graph illustrating several voltage distributions for a multi-level cell memory device.
Figure 2:
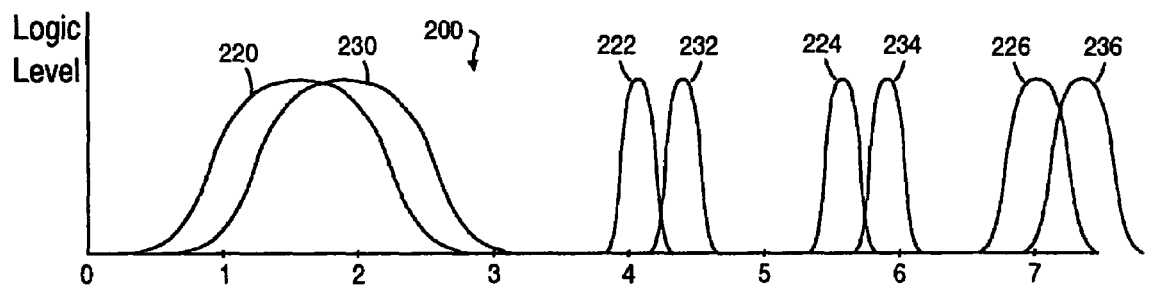
FIG. 2 is a graph illustrating a positive voltage shift in the voltage distributions of FIG. 1.
Figure 3:
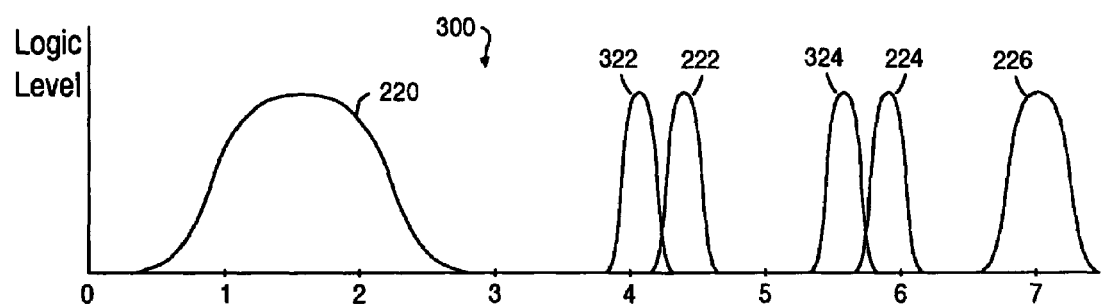
FIG. 3 is a graph illustrating a negative voltage shift in the voltage distributions of FIG. 1.
Figure 4:
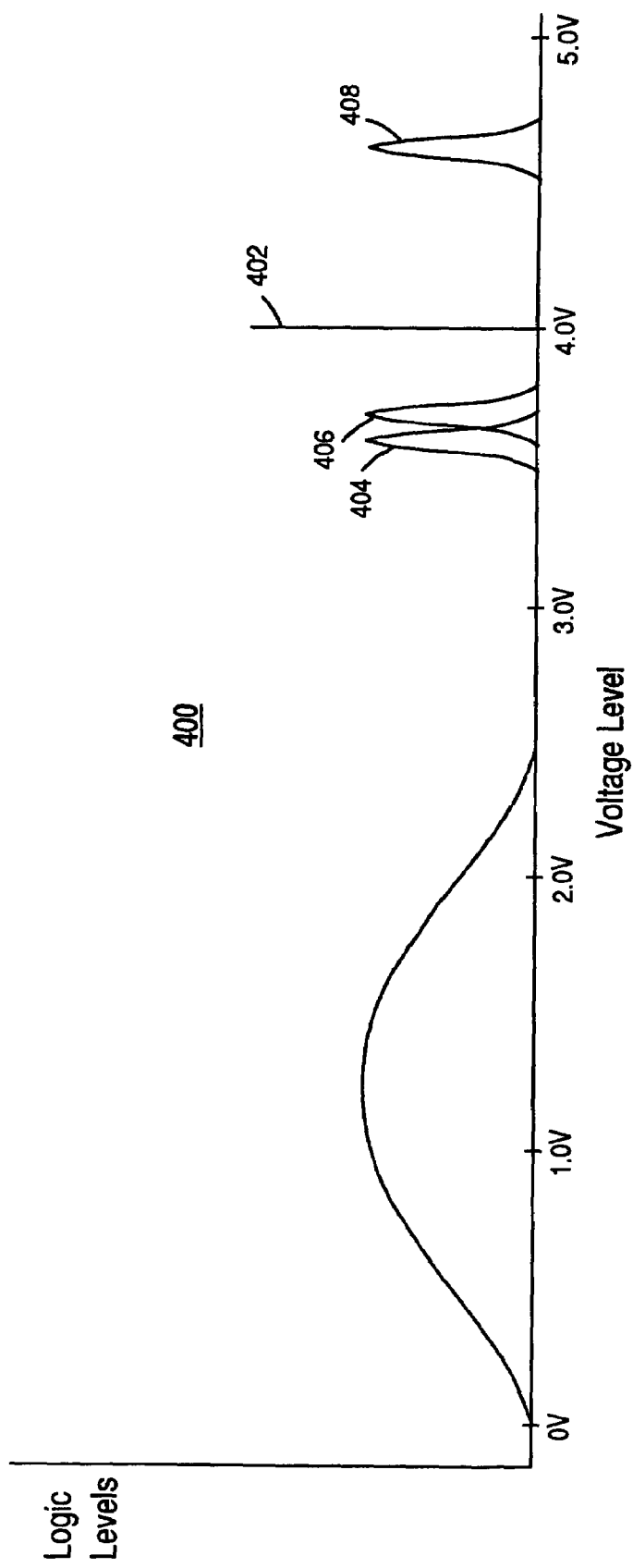
FIG. 4 is a graph illustrating a shift in a narrow voltage distribution that does not cause read error, according to embodiments of the present invention produce.

Because the voltage levels of the stored data can shift to the left or the right as shown in prior art FIG. 2 and prior art FIG. 3, it is beneficial to have narrower program distributions and thus wider program margins. FIG. 4 illustrates an exemplary narrow program distribution of approximately 200 mV, achievable with embodiments of the present invention. If the program distribution 404 is shifted to the right by 100 mV, the data distribution 406 in FIG. 4 will still be read properly at read point 402. The read point 402 at 4.0 volts represents the threshold voltage value that separates the 3.5 volt distribution (curves 404 and 406) from the 4.5 volt distribution 408. That is, if the voltage is above the read point 402 the cell is read as the two bits associated with the 4.5 volt distribution and if the read voltage is below the read point then the cell is read as the two bits associated with the 3.5 volt distribution.

Each time a suitable programming voltage is applied to the memory cell the amount of charge in the floating gate will tend to increase. It is, of course, possible that the programming pulse is not of sufficient magnitude or duration to increase the charge in the floating gate. Applying a very large programming voltage can cause a very large increase in the stored charge, and hence program the memory cell quickly. This is true whether the programming voltage is applied to the gate or to the drain. Conventionally, one or a very few programming pulses, which are high in voltage magnitude, are applied to the gate to achieve fast programming. However, it is easy to overshoot the desired level when using a high magnitude programming voltage. The overshoot is acceptable if a narrow programming distribution is not required. However, a narrow distribution is desired for some applications, such as multi-level cells.

To achieve a desirable narrow range in programming voltage, a series of programming voltages can be applied to the drains of the memory cells, starting with a relatively small voltage magnitude. The voltage magnitude of the pulse can be increased with each pulse. With each pulse, a relatively small amount of charge is added to the floating gate with this technique. Desirably, an individual cell can be programmed very close to the desired level and a group of cells can be programmed to a narrow distribution when using a series of increasing pulses.

Moreover, it is desirable to reduce the time spent programming the memory cells. In order to obtain a narrow distribution, conventional methods apply a programming pulse to the wordline (e.g., the gate) followed by a verify voltage also to the gate. However, the verify voltage needs to be different from the programming voltage with this conventional method. Hence, a certain amount of time is wasted waiting for the voltage to settle down.

Figure 5A:
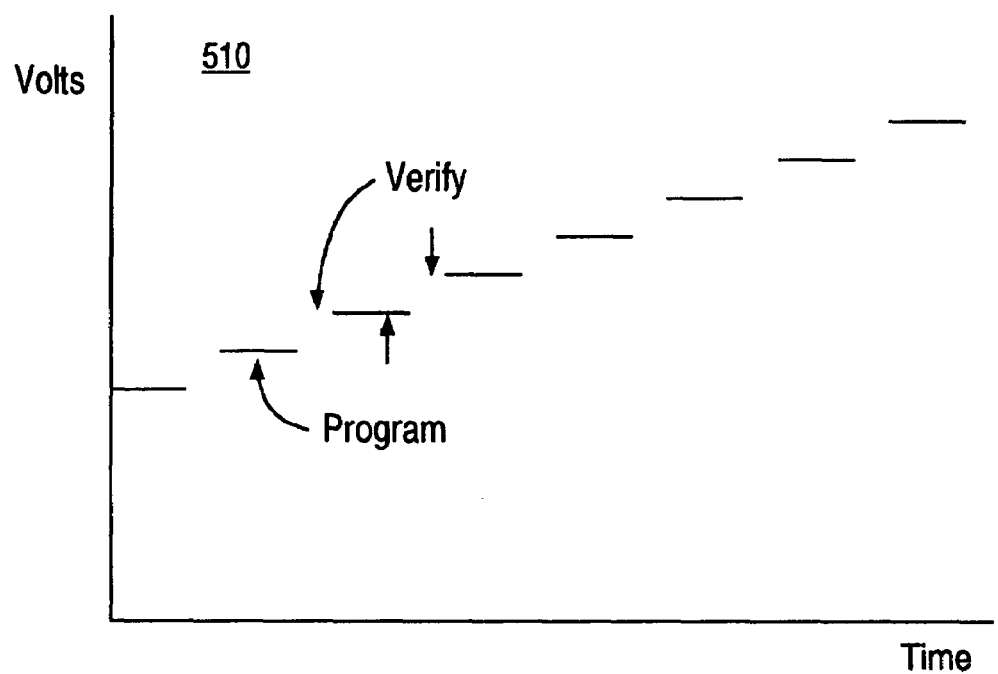
FIG. 5A and FIG. 5B are graphs illustrating exemplary ramped programming voltages, according to embodiments of the present invention.
Figure 5B:
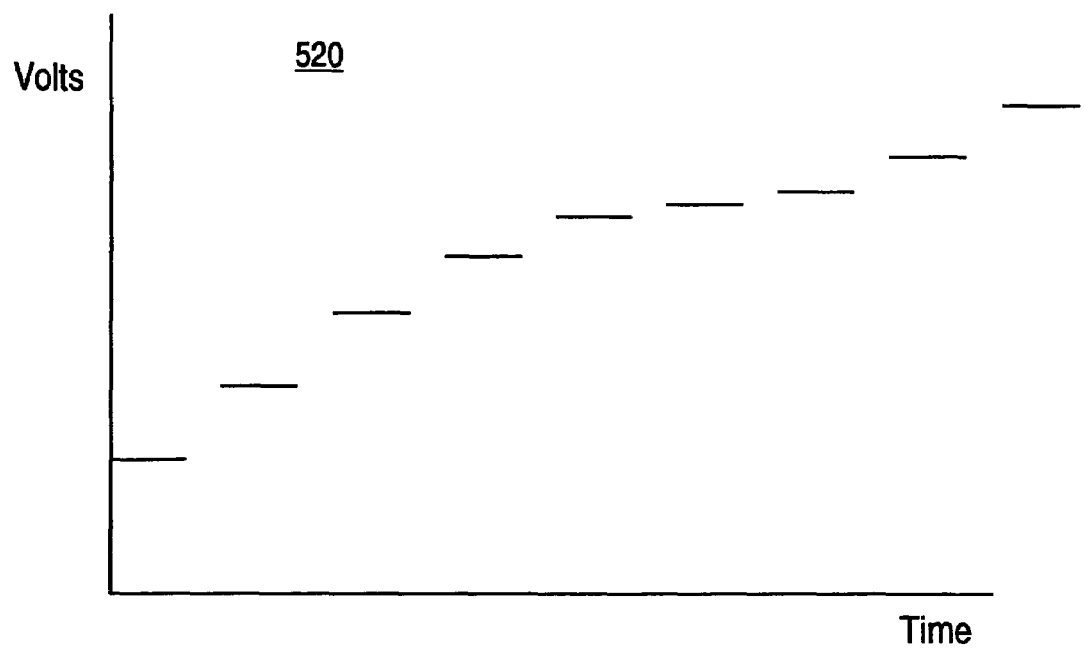
Figure 6:
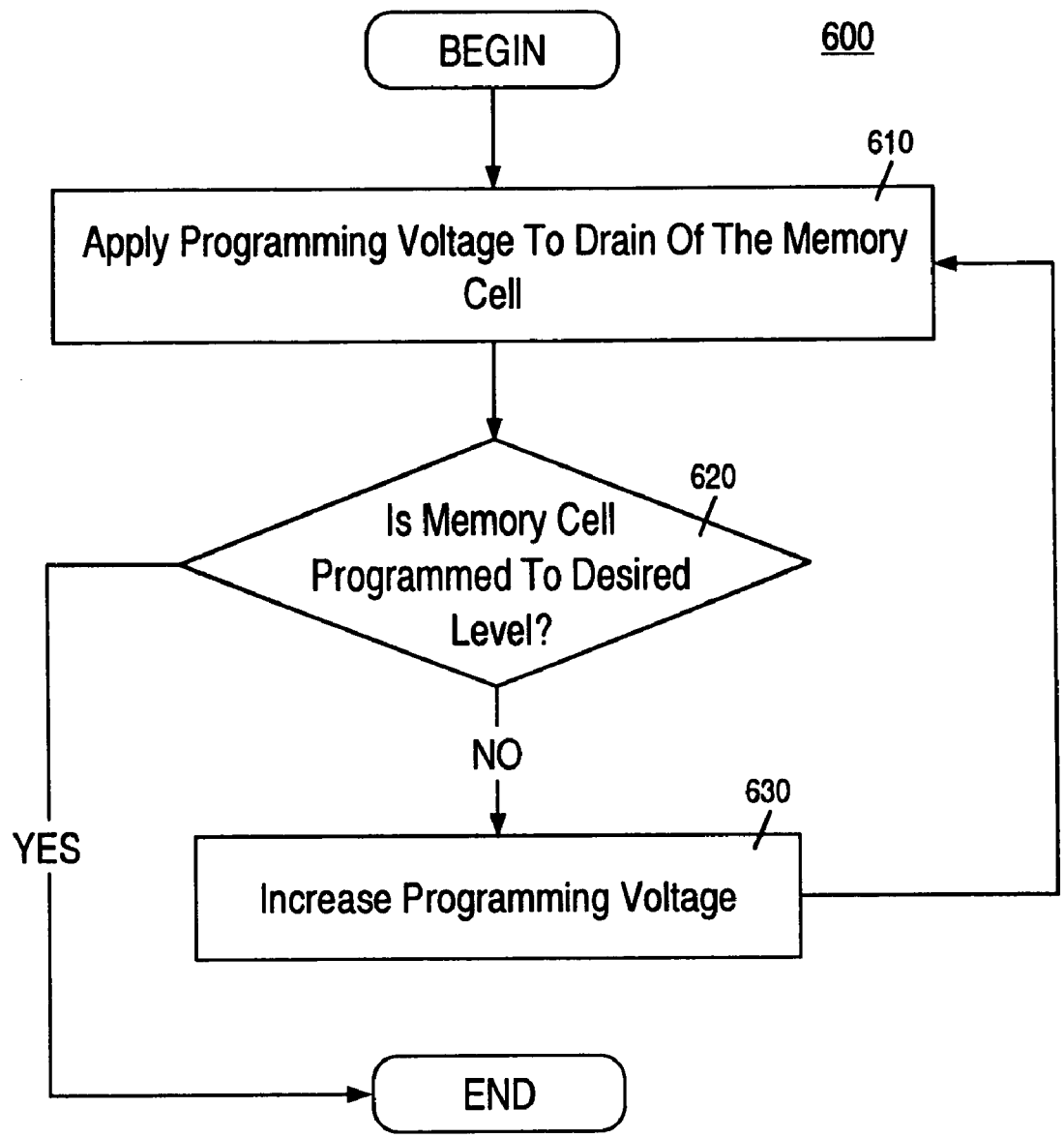
FIG. 6 is a flowchart illustrating steps of a process of accurately programming a memory cell, according to embodiments of the present invention.
Figure 7:
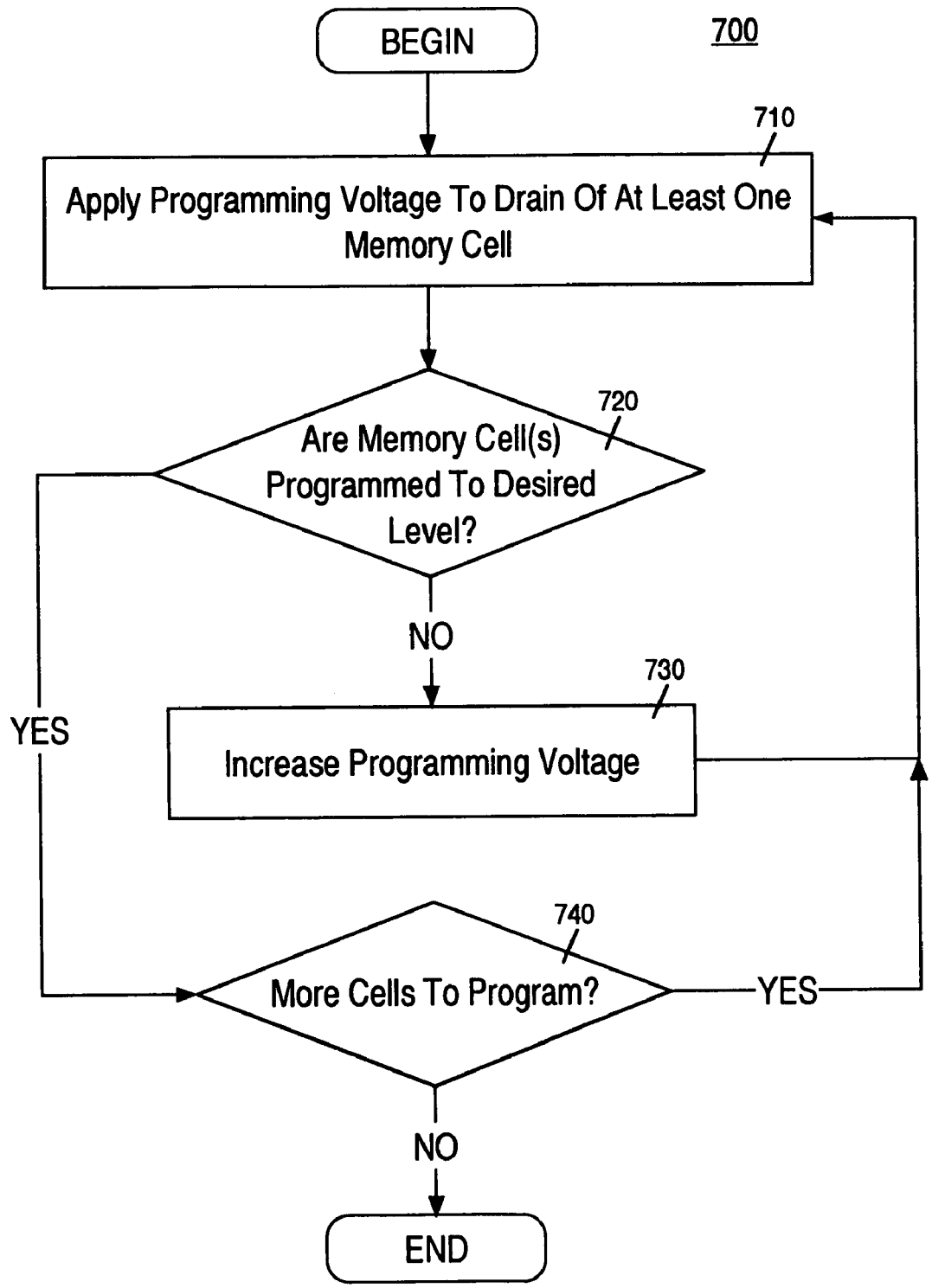
FIG. 7 is a flowchart illustrating steps of a process of programming a memory array in a narrow distribution, according to embodiments of the present invention.

Rather than programming the memory cell by applying a voltage to the gate, embodiments of the present invention apply a voltage to the drain to program the memory cell. Furthermore, the magnitude of each programming pulse is greater than the previous pulse. FIGS. 5A and 5B are graphs illustrating two different exemplary ramped programming voltages, according to embodiments of the present invention. The programming voltage starts relatively low and ramps up until the desired level is reached. The programming level of the memory cell is verified between the voltage steps. It is not required that there be a gap along the time axis between steps as shown in FIGS. 5A and 5B. That is, the voltage may be applied to the drain during the verify. FIG. 5A illustrates a linear ramped programming voltage 510. FIG. 5B illustrates a non-linear ramped programming voltage. Either ramped programming voltage 510, 520 can be applied to the drain or the gate. Moreover, many other shapes to the ramped programming voltages are possible.

The initial programming voltage can be any suitable magnitude that is low enough to not cause overshoot of the desired level. The step size can be any convenient value and does not have to be uniform. In the exemplary linear ramped programming voltage 510, the step size is uniform. However, in the non-linear ramped programming voltage 520, the step size is non-uniform. Because the programming pulse is applied to the drains, the extra amount of additional charge that gets stored in the floating gate as the programming voltage is increased will be highly non-linear. For example, increasing the voltage to the drain causes an increase in the number of charge carriers in the channel region. The amount of voltage on the gate determines how many of the charge carries will be induced into the floating gate region. The relationship between drain voltage and number of channel charge carriers is highly non-linear. Suitable programming voltages can be selected such that a large step size can be used initially without significant risk of overshooting the desire level. The step size is smaller in parts of the non-linear ramped programming voltage 520 in which the creation of charge carriers is more sensitive to changes in drain voltage. In this fashion, the non-linear ramped programming voltage 520 prevents too many additional charge carriers being present in the channel. This keeps the amount of additional charge induced into the floating gate from jumping too fast, and hence prevents overshooting the desired level.

An embodiment of the present invention is a process 600 to accurately program a memory cell. Step 610 is applying a voltage to a drain of the memory cell to program the memory cell. This can be a relatively low voltage, such that the desired level is not likely to be overshot. Step 610 includes applying a suitable voltage to the gate of the cell being programmed, such that charge is induced into the floating gate. This is also a relatively low voltage, such that the desired level is not overshot.

Step 620 is verifying whether the memory cell is programmed to a desired level after applying the voltage. The verifying includes applying a voltage to the gate of the cell being programmed. In one embodiment, the voltage to the gate is kept essentially constant throughout the process 600. Thus, the voltage serves to induce electrons into the floating gate region in step 610 and also serves as the verify voltage to the gate in step 620. In another embodiment, the gate voltage for verifying is different than the one used in the programming stage of step 610. For example, the gate programming voltage can be ramped. In this case, it is likely that, for at least some of the programming process, the verify voltage to the gate will need to be different from the gate programming voltage.

If step 620 determined that the memory cell is not programmed to a sufficient level (e.g., threshold voltage), then step 630 is performed in which the programming voltage to the drain is increased. The voltage to the gate may be increased as well. However, it is not required that the gate programming voltage be ramped. Any suitable step size and duration can be used. Then, the process 600 returns to step 610 and continues until the desired level is reached.

Another embodiment is a process 700 for programming memory cells in a multi-level cell (MLC) memory array in a narrow distribution. The cells can be programmed in parallel or in series. In step 710, a first voltage is applied to a drain of a first memory cell. If parallel programming is being used, the voltage is also applied to the respective drains the other memory cells that are being programmed to this desired level. A suitable programming voltage is applied to the gate(s) to induce charge into the floating gate.

In step 720, the memory cell(s) that were programmed in step 710 are verified to determine if the desired level has been reached after applying the first voltage. The verify voltage applied to the gate(s) may be the same as the gate programming voltage of step 710. In this fashion, this verify step 720 proceeds more rapidly than conventional techniques that apply a different voltage to the gate for verifying than for programming.

If step 720 determined that the desired level has not been reached, then in step 730, the first voltage to the drain(s) is increased and the process 700 returns to step 710 until memory cell(s) are programmed to the desired level. The gate programming voltage may also be increased, if ramped gate programming voltage is desired.

Step 740 is an optional step to cover the serial programming case. For example, if only one memory cell was programmed in steps 710–730, then steps 710 to 730 are repeated for additional memory cells in order to program multiple cells in a narrow programming distribution around the desired level. After programming cells to the first desired level, additional cells can be programmed to a second desired programming level. It will be understood that not all programming distributions have to be narrow. For example, the lowest and highest levels can have wider voltage distributions, while still providing a safe margin.

Figure 8:
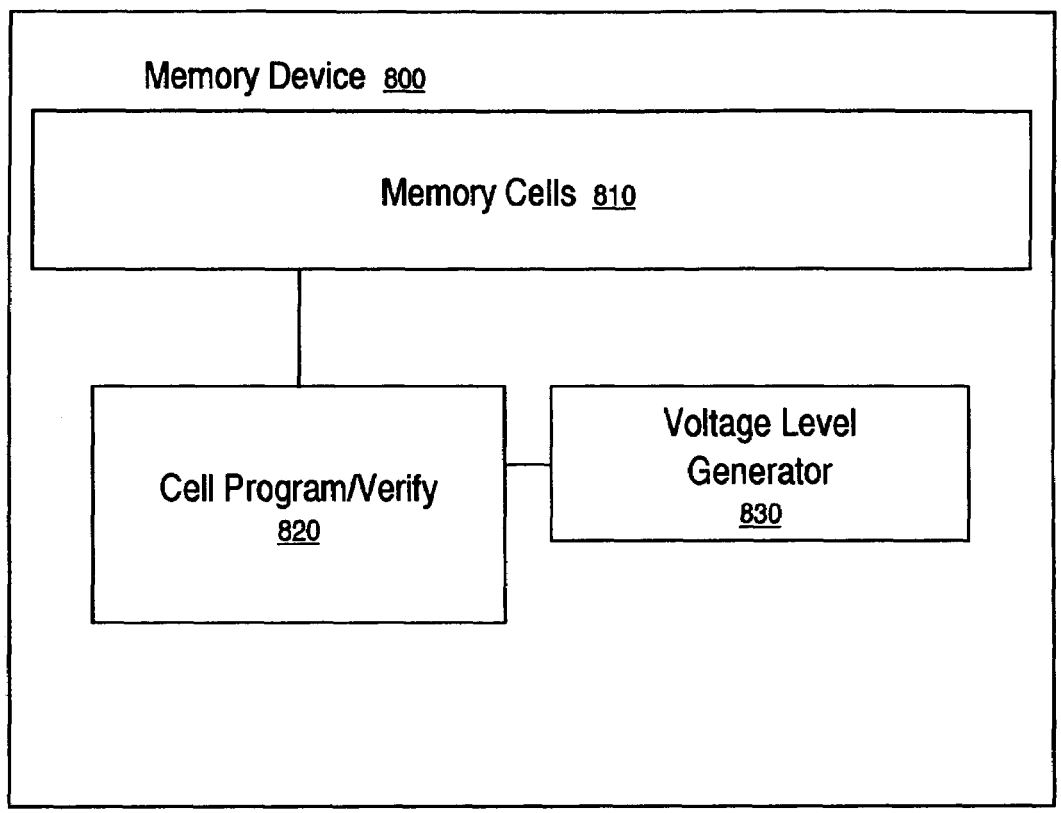
FIG. 8 is a block diagram of a memory device whose memory cells can be programmed to a narrow distribution, according to embodiments of the present invention.

FIG. 8 illustrates a memory device 800 that is capable to programming its memory cells 810 in a narrow distribution, according to an embodiment of the present invention. The memory device 800 has a cell program/verify unit 820, which is capable or applying a programming voltage to the drains of the memory cells that are to be programmed. The program/verify unit 820 also determines whether the memory cell(s) are programmed to the desired level after the programming voltage is applied. The program/verify unit 820 can also apply a programming voltage to the gates of the memory cells 810.

The memory device 800 also has a voltage level generator 830, which is suitable to generate programming voltages, such as the exemplary ramped programming voltages 510, 520 illustrated in FIGS. 5A and 5B. The ramped programming voltages are used to program the drains and may also be used to program the gates, but ramping the gate programming voltage is optional. Those of ordinary skill in the art will recognize that other configurations for the memory device 800 are possible, such as assigning the various functions to other units.

Therefore, it will be seen that embodiments of the present invention provide a method of programming a multi-level cell memory array in a narrow distribution. Embodiments of the present invention are very efficient at programming the array.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for accurately programming a memory cell, comprising:
   a) applying a first voltage to a drain and a second voltage to a gate of said memory cell to program said memory cell;
   b) verifying whether said memory cell is programmed to a desired level after applying said voltage; and
   c) increasing the respective magnitudes of said first voltage to said drain and said second voltage to said gate and repeating said a) and b) until said memory cell is programmed to said desired level, wherein said memory cell is programmed accurately to said desired level.

2. The method of claim 1, further comprising applying a voltage to said gate of said memory cell to verify whether said memory cell is programmed to said desired level.

3. The method of claim 1, wherein said c) comprises increasing said magnitude of said first voltage in a non-linear step size.

4. The method of claim 1, wherein said c) comprises increasing said magnitude of said first voltage in a substantially linear step size.

5. The method of claim 1, wherein said desired level is one of at least three programming levels.

6. The method of claim 1, wherein said desired level is one of at least four programming levels.

7. A method for programming a multi-level cell (MLC) memory array in a narrow distribution, comprising:
   a) applying a first voltage to a drain of a first memory cell;
   b) determining whether said first memory cell is programmed to a desired level after applying said first voltage;
   c) increasing said first voltage and repeating said a) and b) until the first memory cell is programmed to said desired level, wherein said increasing said first voltage comprises a non-linear pattern comprising progressively smaller step sizes followed by progressively larger step sizes; and
   d) performing said a)–c) for at least one additional memory cell in said memory array in order to program a plurality of memory cells in a narrow distribution around said desired level.

8. The method of claim 7, wherein said first memory cell is programmed before programming said at least one additional memory cell.

9. The method of claim 7, wherein said first memory cell is programmed in parallel with said at least one additional memory cell.

10. The method of claim 7, further comprising:
    e) programming a second plurality of cells in said memory array to a second level by performing said a) through said d) until each memory cell of said second plurality of memory cells is programmed to said second level, and wherein said second level is different from the desired level in said b) through said d).

11. The method of claim 7, further comprising applying a substantially constant voltage to a gate of said first memory cell during said a)–c), wherein said voltage applied to said gate is also used in said b) to verify whether said memory cell is programmed to said desired level.

12. The method of claim 7, wherein:
    said a) further comprises applying a voltage to a gate of said first memory cell; and
    said c) further comprises increasing said voltage to said gate of said first memory cell.

13. A multi-level cell memory device comprising:
    an array of memory cells suitable for multi-level programming;
    a first circuit that is operable to apply a first programming voltage to drains and a second programming voltage to gates of said plurality of memory cells;
    a second circuit that is operable to verify whether said plurality of memory cells are programmed to a desired level of a plurality of levels; and
    a third circuit that is operable to increase said first programming voltage to said drains and is further operable to increase said second programming voltage to said gates if said verify indicates additional programming is required to reach said desired level.

14. The multi-level cell memory device of claim 13, wherein said third circuit is further operable to increase said first programming voltage to said drains in a non-linear fashion.

15. The multi-level cell memory device of claim 14, wherein said third circuit is further operable to increase said second programming voltage to said gates of said memory cells in a linear fashion.

* * * * *